(12) United States Patent
Chang et al.

(10) Patent No.: US 8,374,010 B2
(45) Date of Patent: Feb. 12, 2013

(54) POWER SUPPLY CIRCUIT AND CONTROL METHOD THEREOF

(75) Inventors: Shih-Hsien Chang, Taoyuan Hsien (TW); Po-Nien Ko, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 391 days.

(21) Appl. No.: 12/836,557

(22) Filed: Jul. 14, 2010

(65) Prior Publication Data

US 2011/0012881 A1    Jan. 20, 2011

(30) Foreign Application Priority Data

Jul. 17, 2009   (TW) ............................. 98124290 A (51) Int. Cl.
*H02M 7/48* (2007.01)
(52) U.S. Cl. ................. 363/71; 363/16; 307/82
(58) Field of Classification Search .............. 363/16, 363/17, 25, 21.02, 21.04, 37, 61, 65, 72, 363/95; 323/207, 224, 267, 272, 282–290; 307/75, 82, 112, 64, 66, 31, 147, 151
See application file for complete search history.

(56) References Cited

U.S. PATENT DOCUMENTS

| | | | | |
|---|---|---|---|---|
| 4,062,057 A | * | 12/1977 | Perkins et al. | 363/71 |
| 5,495,136 A | * | 2/1996 | Chiang et al. | 310/339 |
| 5,982,642 A | * | 11/1999 | Herfurth | 363/21.08 |
| 6,137,702 A | * | 10/2000 | Hall et al. | 363/95 |
| 8,243,473 B2 | * | 8/2012 | Chen et al. | 363/16 |

* cited by examiner

*Primary Examiner* — Rajnikant Patel (57) ABSTRACT

A power supply circuit for receiving an input voltage to drive a plurality of loads is disclosed. The power supply circuit comprises a plurality of switch circuits, a plurality of power conversion circuits and a phase delay circuit. The plurality of switch circuits are connected with the plurality of loads, respectively. The plurality of power conversion circuits are connected with the plurality of loads and the plurality of switch circuits, respectively, for converting the input voltage into a plurality of driving voltages and transmitting the plurality of driving voltages to the plurality of loads, respectively, when the plurality of switch circuits are conducted. The phase delay circuit is connected with the plurality of switch circuits and a system circuit for generating a plurality of delay signals in response to a switch signal from the system circuit and transmitting the plurality of delay signals to control terminals of the plurality of switch circuits, respectively, so as to make the plurality of switch circuits be conducted or shut off. The plurality of delay signals are converted into an enabling status from a disabling status at different time points so that the plurality of switch circuits are conducted at different time points.

19 Claims, 7 Drawing Sheets

POWER SUPPLY CIRCUIT AND CONTROL METHOD THEREOF

CLAIM OF PRIORITY

This application claims priority to Taiwanese Patent Application No. 098124290 filed on Jul. 17, 2009.

FIELD OF THE INVENTION

The present invention relates to a power supply circuit and a control method thereof, and more particularly to a power supply circuit having a plurality of switch circuits and a control method thereof.

BACKGROUND OF THE INVENTION

With the progress of technology, various loads, such as light emitting diodes (LEDs), driven by power and having various functions have been developed. These loads satisfy people having various requirements and contribute human's daily life, and thus enable people to have more convenient life.

Generally speaking, the loads are connected with a power supply circuit so as to obtain power for operation from the power supply circuit. In case that the load is an LED, when the LED is applied to a device, such as an LCD panel, the LED is connected with a power supply circuit to be driven by the power supply circuit and emit light. The power supply circuit mainly includes at least one power conversion circuit and at least one switch circuit. The switch circuit is conducted or shut off according to a switch signal outputted from a system circuit of the LCD panel. The power conversion circuit is connected with the LED and the switch circuit, and is used to convert the received power, such as the commercial power, into a driving voltage required by the LED for driving the LED to emit light when the switch circuit is conducted.

Certainly, the power supply circuit can be connected with multiple sets of LEDs to drive the multiple sets of LEDs to emit light at the same time. To enable the power received by each set of the LEDs to be precisely controlled so that the brightness of the LEDs can be maintained at a predetermined value, the power supply circuit includes a plurality of power conversion circuits and a plurality of switch circuits, which are corresponding to the multiple sets of LEDs. The plurality of switch circuits are simultaneously conducted or shut off according to the switch signal outputted from the system circuit. Each power conversion circuit and each switch circuit are connected with a set of LEDs, respectively. When the plurality of switch circuits receive the switch signal and are simultaneously conducted, each power conversion circuit converts the received power into the driving voltage required by the corresponding LEDs, so that the brightness of each set of the LEDs can be maintained at a predetermined value.

Although the conventional power supply circuit can drive the multiple sets of LEDs through the plurality of power conversion circuits and the plurality of switch circuits, it still has some drawbacks as the plurality of switch circuits are simultaneously conducted or shut off. For example, when the plurality of switch circuits of the power supply circuit are simultaneously conducted or shut off, the input current in the power supply circuit is abruptly increased or decreased, and thus a significant audio noise is generated in the power supply circuit. Further, when the plurality of switch circuits are simultaneously conducted, since the input current is abruptly increased, a great inrush current is generated in the power supply circuit. As a consequence, the power supply circuit may shut down or have unexpected mal-operation, and even more, the electronic components in the power supply circuit may be damaged.

Therefore, it is needed to provide a power supply circuit and a control method thereof to obviate the drawbacks encountered from the prior art.

SUMMARY OF THE INVENTION

It is an object of the present invention to provide a power supply circuit and a control method thereof, wherein the plurality of switch circuits in the power supply circuit are conducted or shut off at different time points. Therefore, the input current of the power supply circuit would not be increased or decreased abruptly during the operations of the switch circuits, and thus the generation of the audio noise could be eliminated. Further, the power supply circuit is not easy to shut down and has a better stability, and the electronic components in the power supply circuit are not easy to be damaged.

In accordance with a first aspect of the present invention, there is provided a power supply circuit for receiving an input voltage to drive a first load and a second load. The power supply circuit comprises a first switch circuit, a second switch circuit, a first power conversion circuit, a second power conversion circuit and a phase delay circuit. The first switch circuit is connected with the first load, and the second switch circuit is connected with the second load. The first power conversion circuit is connected with the first load and the first switch circuit, and the second power conversion circuit is connected with the second load and the second switch circuit. The first power conversion circuit and the second power conversion circuit convert the input voltage into a driving voltage and transmit the driving voltage to the first load and the second load, respectively, when the first switch circuit and the second switch circuit are conducted. The phase delay circuit is connected with the first switch circuit, the second switch circuit and a system circuit for generating a first delay signal and a second delay signal in response to a switch signal from the system circuit and transmitting the first delay signal and the second delay signal to control terminals of the first switch circuit and the second switch circuit, respectively, so as to make the first switch circuit and the second switch circuit be conducted or shut off. The first delay signal and the second delay signal are converted into an enabling status from a disabling status at different time points so that the first switch circuit and the second switch circuit are conducted at different time points.

In accordance with a second aspect of the present invention, there is provided a control method of a power supply circuit for controlling a plurality of switch circuits to be conducted at different time points. The control method of the power supply circuit comprises steps of (a) receiving a switch signal, and (b) outputting a plurality of delay signals to control terminals of the plurality of switch circuits according to the switch signal and making the plurality of delay signals be converted into an enabling status from a disabling status at different time points.

In accordance with a third aspect of the present invention, there is provided a power supply circuit for receiving an input voltage to drive a plurality of loads. The power supply circuit comprises a plurality of switch circuits, a plurality of power conversion circuits and a phase delay circuit. The plurality of switch circuits are connected with the plurality of loads, respectively. The plurality of power conversion circuits are connected with the plurality of loads and the plurality of switch circuits, respectively, for converting the input voltage into a plurality of driving voltages and transmitting the plurality of driving voltages to the plurality of loads, respectively, when the plurality of switch circuits are conducted. The phase delay circuit is connected with the plurality of switch circuits and a system circuit for generating a plurality of delay signals in response to a switch signal from the system circuit and transmitting the plurality of delay signals to control terminals of the plurality of switch circuits, respectively, so as to make the plurality of switch circuits be conducted or shut off. The plurality of delay signals are converted into an enabling status from a disabling status at different time points so that the plurality of switch circuits are conducted at different time points.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
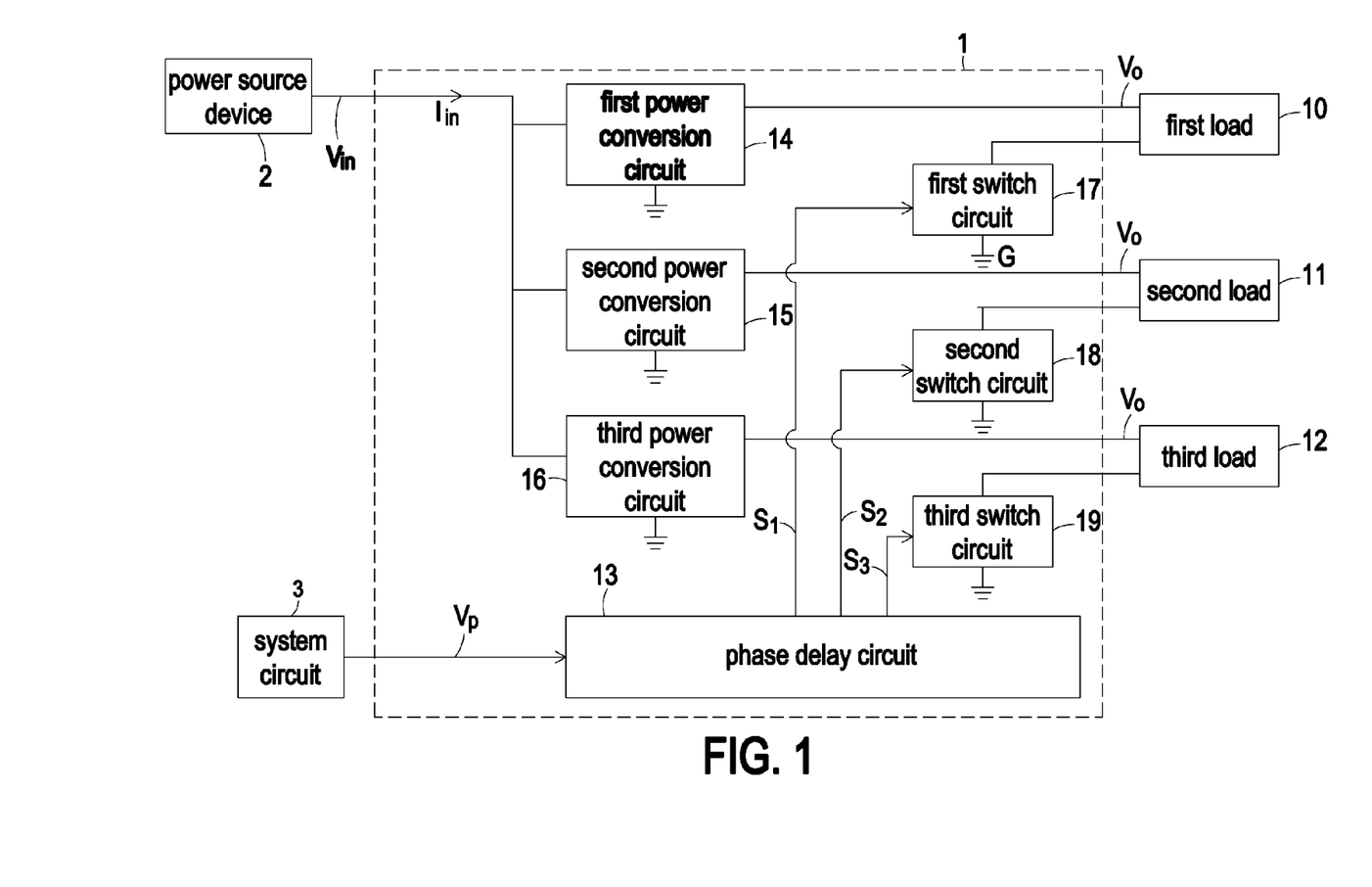
FIG. 1 is a schematic circuit block diagram of a power supply circuit according to a preferred embodiment of the present invention.

FIG. 1 is a schematic circuit block diagram of a power supply circuit according to a preferred embodiment of the present invention. As shown in FIG. 1, the power supply circuit 1 is connected with a power source device 2 and a plurality of loads, such as a first load 10, a second load 11, and a third load 12. The power supply circuit 1 receives an input voltage $V_{in}$ from the power source device 2 and converts the input voltage $V_{in}$ into a plurality of driving voltages $V_o$, which are provided to the first load 10, the second load 11 and the third load 12 to drive the operations of the first load 10, the second load 11 and the third load 12.

The power supply circuit 1 mainly comprises a phase delay circuit 13, a plurality of power conversion circuits and a plurality of switch circuits, wherein the number of the power conversion circuits and the number of the switch circuits are respectively corresponding to but not limited to the number of the loads connected to the power supply circuit 1. As shown in FIG. 1, the power supply circuit 1 is connected with the first load 10, the second load 11 and the third load 12, and thus, the power supply circuit 1 comprises a first power conversion circuit 14, a second power conversion circuit 15 and a third power conversion circuit 16, and a first switch circuit 17, a second switch circuit 18 and a third switch circuit 19.

The first switch circuit 17 is connected with a common terminal G and the first load 10, the second switch circuit 18 is connected with the common terminal G and the second load 11, and the third switch circuit 19 is connected with the common terminal G and the third load 12. The first switch circuit 17, the second switch circuit 18 and the third switch circuit 19 are respectively connected with the phase delay circuit 13 to receive delay signals outputted from the phase delay circuit 13, such as a first delay signal $S_1$, a second delay signal $S_2$, and a third delay signal $S_3$ shown in FIG. 1. The first switch circuit 17, the second switch circuit 18 and the third switch circuit 19 are respectively conducted or shut off according to the first delay signal $S_1$, the second delay signal $S_2$, and the third delay signal $S_3$.

The input terminals of the first power conversion circuit 14, the second power conversion circuit 15 and the third power conversion circuit 16 are connected with the power source device 2 to receive the input voltage $V_{in}$. The output terminals of the first power conversion circuit 14, the second power conversion circuit 15 and the third power conversion circuit 16 are connected with the first load 10, the second load 11 and the third load 12, respectively. The first power conversion circuit 14, the second power conversion circuit 15 and the third power conversion circuit 16 are further connected with the first switch circuit 17, the second switch circuit 18 and the third switch circuit 19 through the first load 10, the second load 11 and the third load 12, respectively. The first power conversion circuit 14, the second power conversion circuit 15 and the third power conversion circuit 16 convert the input voltage $V_{in}$ into the driving voltage $V_o$ and output the driving voltage $V_o$ to the first load 10, the second load 11 and the third load 12, respectively, when the first switch circuit 17, the second switch circuit 18 and the third switch circuit 19 are conducted. In other words, the power supply circuit 1 outputs a plurality of driving voltages $V_o$ to the first load 10, the second load 11 and the third load 12 through the first power conversion circuit 14, the second power conversion circuit 15 and the third power conversion circuit 16, respectively, when the first switch circuit 17, the second switch circuit 18 and the third switch circuit 19 are conducted, so as to drive the operations of the first load 10, the second load 11 and the third load 12.

The phase delay circuit 13 is connected with a system circuit 3 to receive a switch signal $V_p$ from the system circuit 3, wherein the switch signal $V_p$ is a signal having enabling status and disabling status for controlling the operations of the first switch circuit 17, the second switch circuit 18 and the third switch circuit 19. Further, the phase delay circuit 13 is connected with the first switch circuit 17, the second switch circuit 18 and the third switch circuit 19. The phase delay circuit 13 generates the first delay signal $S_1$, the second delay signal $S_2$, and the third delay signal $S_3$ in response to the switch signal $V_p$ of the system circuit 3, and transmits the first delay signal $S_1$, the second delay signal $S_2$, and the third delay signal $S_3$ to respective control terminals of the first switch circuit 17, the second switch circuit 18 and the third switch circuit 19.

In this embodiment, the first delay signal $S_1$, the second delay signal $S_2$, and the third delay signal $S_3$ are converted into the enabling status from the disabling status at different time points, so that the first switch circuit 17, the second switch circuit 18 and the third switch circuit 19 are conducted at different time points. As a consequence, the input current $I_{in}$ in the power supply circuit 1 is not increased abruptly, and thus, the audio noise and the great inrush current caused by the abruptly increased current in the conventional power supply circuit would be eliminated. Therefore, the power supply circuit 1 is not easy to shut down and has a better stability, and the electronic components in the power supply circuit 1 are not easy to be damaged.

The system circuit 3 may have different embodied manners according to functions and applications of the loads. For example, when the loads are light emitting diodes (LEDs), the system circuit 3 may accordingly applied in an LCD panel, so that the LCD panel can control the operations of the LEDs through the system circuit 3. In addition, the switch signal $V_p$ outputted from the system circuit 3 is but not limited to a pulse width modulation (PWM) signal.

Figure 2:
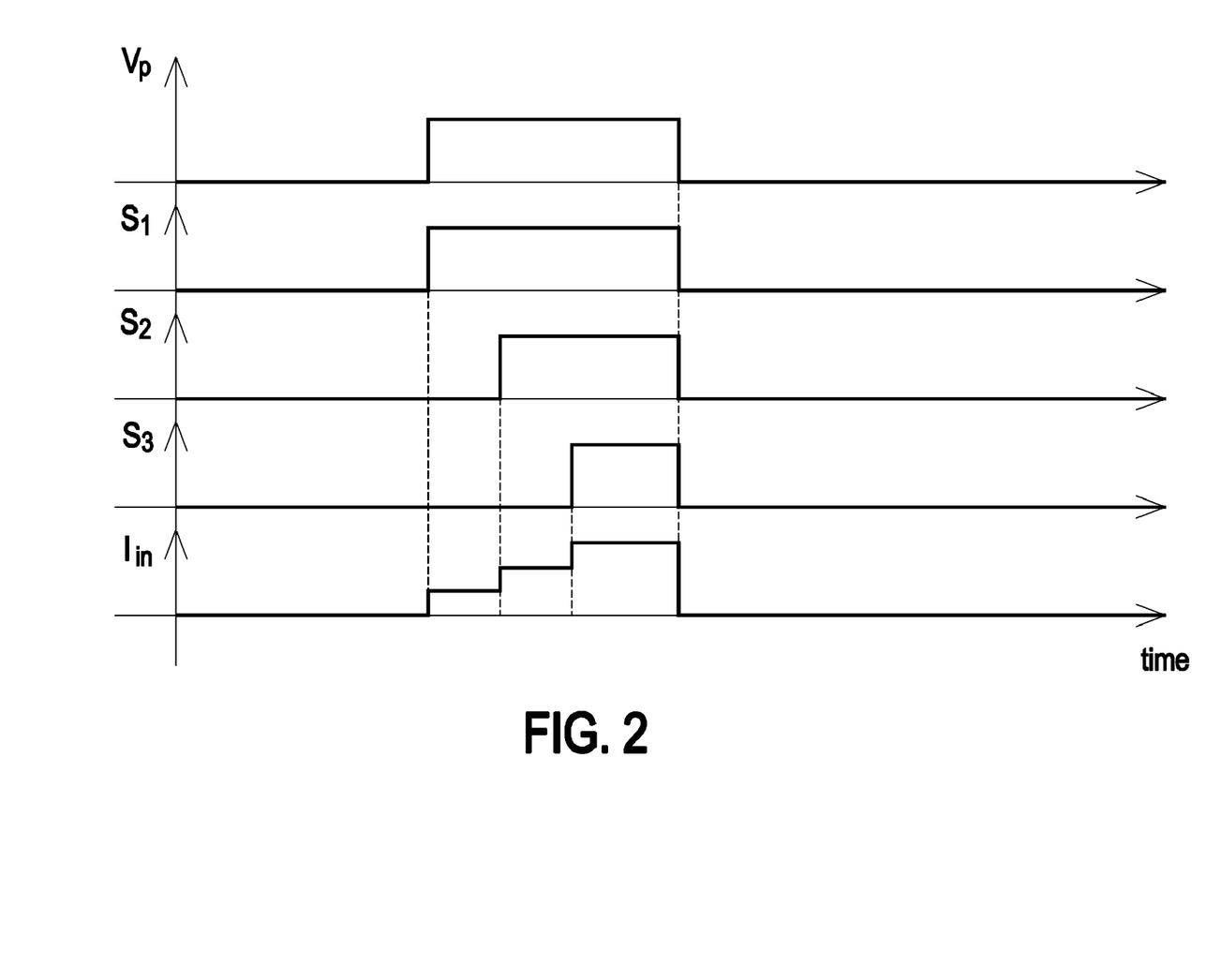
FIG. 2 is a timing chart of the voltage, the current and the signal statuses in relation to FIG. 1.

The technique of the present invention is illustrated as followed by taking the example that the switch signal $V_p$ is a PWM signal. Please refer to FIG. 1 and FIG. 2, wherein FIG. 2 is a timing chart of the voltage, the current and the signal statuses in relation to FIG. 1. As shown in FIG. 1 and FIG. 2, when the phase delay circuit 13 receives the switch signal $V_p$, which is a PWM signal, outputted from the system circuit 3, it outputs and transmits the first delay signal $S_1$, the second delay signal $S_2$, and the third delay signal $S_3$ to the first switch circuit 17, the second switch circuit 18 and the third switch circuit 19, respectively, in response to the switch signal $V_p$. Since the first delay signal $S_1$, the second delay signal $S_2$, and the third delay signal $S_3$ are converted into the enabling status from the disabling status at different time points, and thus, the first switch circuit 17, the second switch circuit 18 and the third switch circuit 19 are conducted at different time points according to the first delay signal $S_1$, the second delay signal $S_2$, and the third delay signal $S_3$. As a consequence, the input current $I_{in}$ is increased in a step manner at the timings that the first switch circuit 17, the second switch circuit 18 and the third switch circuit 19 are respectively conducted, as shown in FIG. 2. Therefore, the input current $I_{in}$ is not abruptly increased when the first switch circuit 17, the second switch circuit 18 and the third switch circuit 19 are converted into the conducted status from the shut off status, so the generation of audio noise as in the conventional power supply circuit can be reduced.

Figure 3:
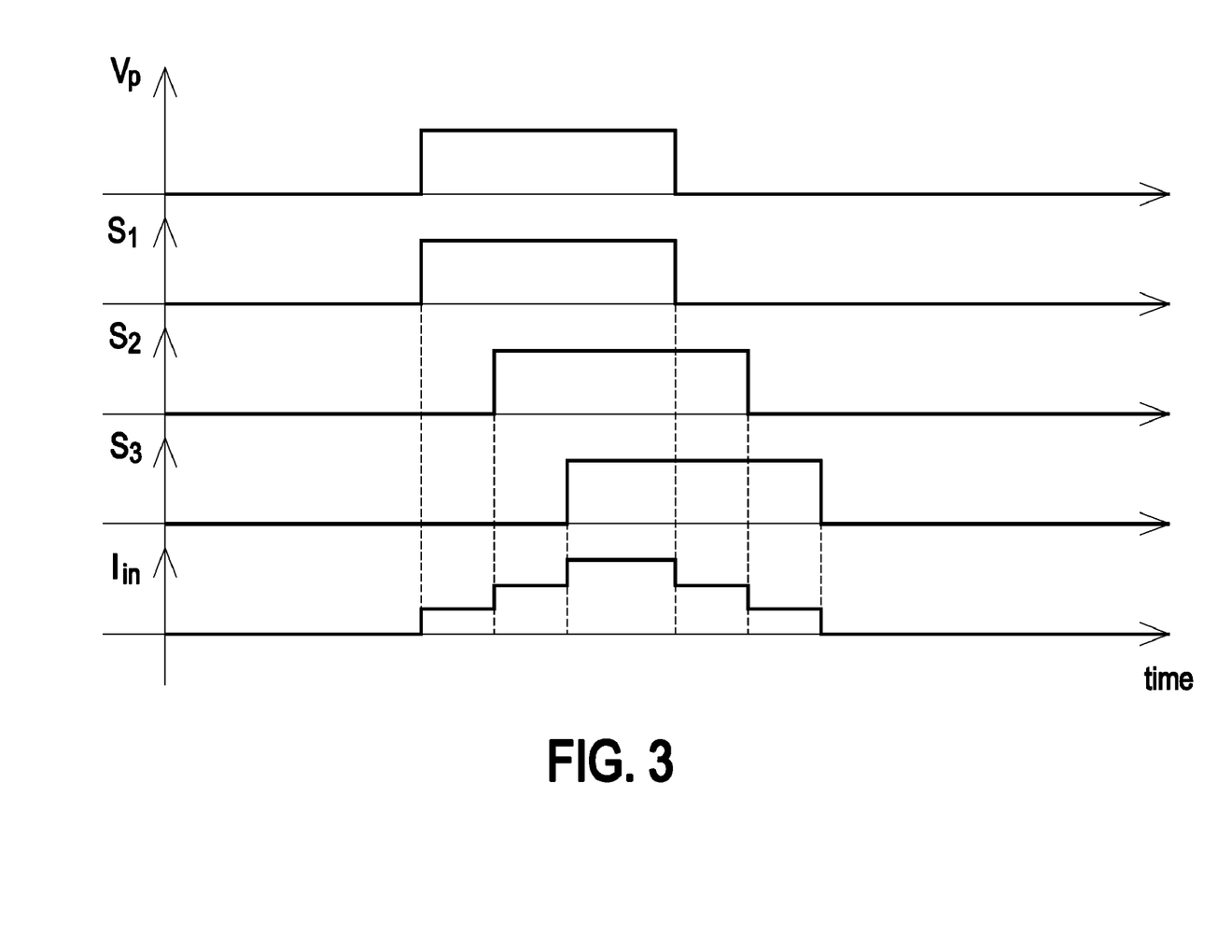
FIG. 3 is another timing chart of the voltage, the current and the signal statuses in relation to FIG. 1.

In some embodiments, the phase delay circuit 13 not only makes the first delay signal $S_1$, the second delay signal $S_2$, and the third delay signal $S_3$ be converted into the enabling status from the disabling status at different time points so as to make the first switch circuit 17, the second switch circuit 18 and the third switch circuit 19 be conducted at different time points, but also makes the first delay signal $S_1$, the second delay signal $S_2$, and the third delay signal $S_3$ be converted into the disabling status from the enabling status at different time points so as to make the first switch circuit 17, the second switch circuit 18 and the third switch circuit 19 be shut off at different time points. As a consequence, the input current $I_{in}$ is decreased in a step manner at the timings that the first switch circuit 17, the second switch circuit 18 and the third switch circuit 19 are respectively shut off, as shown in FIG. 3. Therefore, the input current $I_{in}$ is not abruptly decreased when the first switch circuit 17, the second switch circuit 18 and the third switch circuit 19 are converted into the shut off status from the conducted status, so the generation of audio noise as in the conventional power supply circuit can be reduced.

Figure 4:
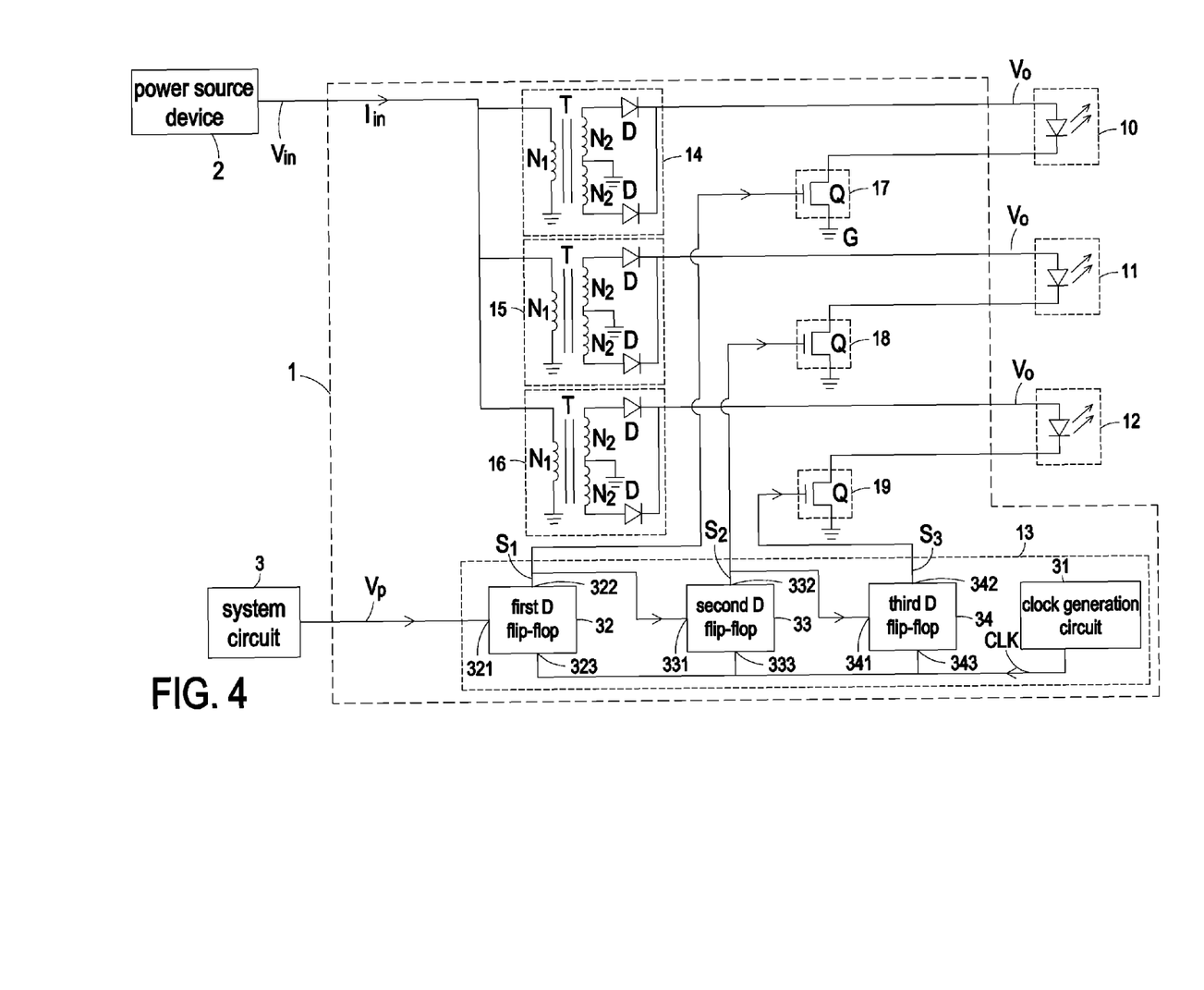
FIG. 4 is a schematic detailed circuit diagram illustrating the power supply circuit shown in FIG. 1.

The structure and the operation of the power supply circuit 1 will be described more specifically with reference to FIG. 4. FIG. 4 is a schematic detailed circuit diagram illustrating the power supply circuit shown in FIG. 1. For illustration, the first load 10, the second load 11 and the third load 12 are LEDs, and the system circuit 3 is applied in an LCD panel, but not limited thereto.

In this embodiment, the phase delay circuit 13 comprises a clock generation circuit 31 and a plurality of D flip-flops, such as a first D flip-flop 32, a second D flip-flop 33 and a third D flip-flop 34. The clock generation circuit 31 outputs a clock signal CLK, which is but not limited to a high frequency signal. The first D flip-flop 32 has a first data input terminal 321, a first data output terminal 322 and a first trigger terminal 323, wherein the first data input terminal 321 is connected with the system circuit 3 to receive the switch signal $V_p$ outputted from the system circuit 3, the first trigger terminal 323 is connected with the clock generation circuit 31 to receive the clock signal CLK outputted from the clock generation circuit 31, and the first data output terminal 322 is connected with the control terminal of the first switch circuit 17. The first D flip-flop 32 outputs the first delay signal $S_1$ from the first data output terminal 322 to the first switch circuit 17 according to the switch signal $V_p$ and the clock signal CLK. The second D flip-flop 33 has a second data input terminal 331, a second data output terminal 332 and a second trigger terminal 333, wherein the second data input terminal 331 is connected with the first data output terminal 322 of the first D flip-flop 32 to receive the first delay signal $S_1$ outputted from the first data output terminal 322, the second trigger terminal 333 is connected with the clock generation circuit 31 to receive the clock signal CLK outputted from the clock generation circuit 31, and the second data output terminal 332 is connected with the control terminal of the second switch circuit 18. The second D flip-flop 33 outputs the second delay signal $S_2$ from the second data output terminal 332 to the second switch circuit 18 according to the first delay signal $S_1$ and the clock signal CLK. The third D flip-flop 34 has a third data input terminal 341, a third data output terminal 342 and a third trigger terminal 343, wherein the third data input terminal 341 is connected with the second data output terminal 332 of the second D flip-flop 33 to receive the second delay signal $S_2$ outputted from the second data output terminal 332, the third trigger terminal 343 is connected with the clock generation circuit 31 to receive the clock signal CLK outputted from the clock generation circuit 31, and the third data output terminal 342 is connected with the control terminal of the third switch circuit 19. The third D flip-flop 34 outputs the third delay signal $S_3$ from the third data output terminal 342 to the third switch circuit 19 according to the second delay signal $S_2$ and the clock signal CLK.

Figure 5:
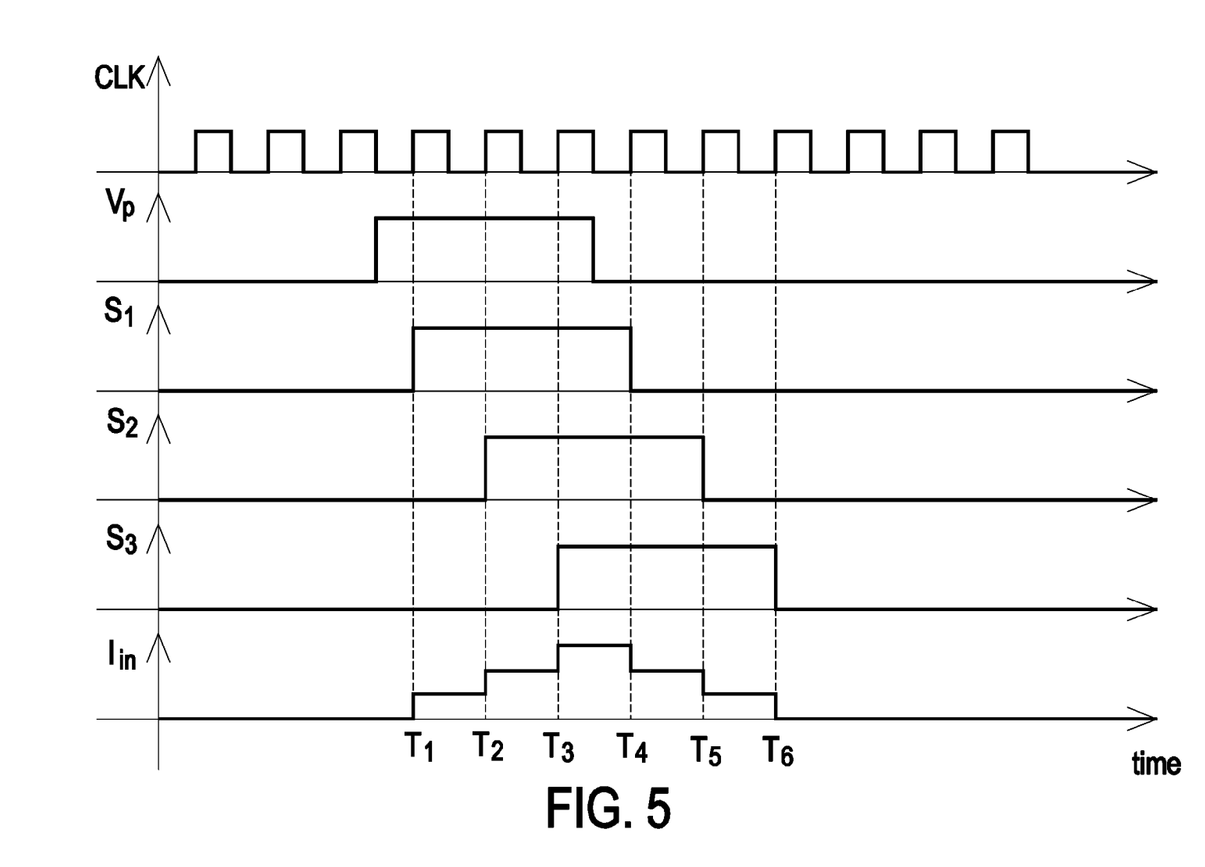
FIG. 5 is a timing chart of the voltage, the current and the signal statuses in relation to FIG. 4.

The embodiment shown in FIG. 4 will be further described as followed by taking the example that the switch signal $V_p$ is a PWM signal. Please refer to FIG. 4 and FIG. 5, wherein FIG. 5 is a timing chart of the voltage, the current and the signal statuses in relation to FIG. 4. As shown in FIG. 4 and FIG. 5, the first D flip-flop 32 receives the switch signal $V_p$, which is a PWM signal, transmitted from the system circuit 3 through the first data input terminal 321, and receives the clock signal CLK from the clock generation circuit 31 through the first trigger terminal 323. Due to the property of the D flip-flop, after the switch signal $V_p$ is converted into the enabling status from the disabling status, the first delay signal $S_1$ outputted from the first D flip-flop 32 is triggered by the rising edge of the CLK signal and thus converted into the enabling status from the disabling status, as shown at the time point $T_1$ in FIG. 5. On the other hand, after the switch signal $V_p$ is converted into the disabling status from the enabling status, the first delay signal $S_1$ is triggered by the rising edge of the CLK signal and thus converted into the disabling status from the enabling status, as shown at the time point $T_4$ in FIG. 5.

Similar to the operation of the first D flip-flop 32 described above, the second D flip-flop 33 receives the first delay signal $S_1$ transmitted from the first D flip-flop 32 through the second data input terminal 331, and receives the clock signal CLK from the clock generation circuit 31 through the second trigger terminal 333. After the first delay signal $S_1$ is converted into the enabling status from the disabling status, the second delay signal $S_2$ outputted from the second D flip-flop 33 is triggered by the rising edge of the CLK signal and thus converted into the enabling status from the disabling status, as shown at the time point $T_2$ in FIG. 5. On the other hand, after the first delay signal $S_1$ is converted into the disabling status from the enabling status, the second delay signal $S_2$ is triggered by the rising edge of the CLK signal and thus converted into the disabling status from the enabling status, as shown at the time point $T_5$ in FIG. 5.

Similarly, the third D flip-flop 34 receives the second delay signal $S_2$ transmitted from the second D flip-flop 33 through the third data input terminal 341, and receives the clock signal CLK from the clock generation circuit 31 through the third trigger terminal 343. After the second delay signal $S_2$ is converted into the enabling status from the disabling status, the third delay signal $S_3$ outputted from the third D flip-flop 34 is triggered by the rising edge of the CLK signal and thus converted into the enabling status from the disabling status, as shown at the time point $T_3$ in FIG. 5. On the other hand, after the second delay signal $S_2$ is converted into the disabling status from the enabling status, the third delay signal $S_3$ is triggered by the rising edge of the CLK signal and thus converted into the disabling status from the enabling status, as shown at the time point $T_6$ in FIG. 5.

As shown in FIG. 5, due to the properties of the first D flip-flop 32, the second D flip-flop 33 and the third D flip-flop 34, the first delay signal $S_1$, the second delay signal $S_2$, and the third delay signal $S_3$ are converted into the enabling status from the disabling status at different time points, so that the first switch circuit 17, the second switch circuit 18 and the third switch circuit 19 can be conducted at different time points. In addition, the first delay signal $S_1$, the second delay signal $S_2$, and the third delay signal $S_3$ are converted into the disabling status from the enabling status at different time points, so that the first switch circuit 17, the second switch circuit 18 and the third switch circuit 19 can be shut off at different time points. Therefore, the power supply circuit 1 provided by the present invention can obviate the drawbacks of the conventional power supply circuit resulted from that the switch circuits thereof are simultaneously conducted or shut off.

Please refer to FIG. 4 again. In some embodiments, each of the first switch circuit 17, the second switch circuit 18 and the third switch circuit 19 includes but not limited to one switch component Q. The first power conversion circuit 14 includes but not limited to a transformer T and a plurality of rectifier diodes D, wherein the transformer T is a center-tapped transformer, a primary winding $N_1$ of the transformer T is connected with the power source device 2 to receive the input voltage $V_{in}$ from the power source device 2, and a plurality of secondary windings $N_2$ of the transformer T are connected with the plurality of rectifier diodes D, respectively. The transformer T converts the input voltage $V_{in}$ into a voltage having a predetermined voltage value according to the operation of the first switch circuit 17. The plurality of rectifier diodes D are connected with the first load 10 for rectifying the voltage transmitted from the transformer T and outputting the driving voltage $V_o$ to the first load 10. The structures of the second power conversion circuit 15 and the third power conversion circuit 16 are similar to those of the first power conversion circuit 14, and the same components are represented by the same symbols, so the components and the operations between the components in the second power conversion circuit 15 and the third power conversion circuit 16 are not redundantly described here.

On the other hand, the present invention also provides a control method of the power supply circuit, and the steps of the control method of the power supply circuit will be described in the following paragraphs.

Figure 6:
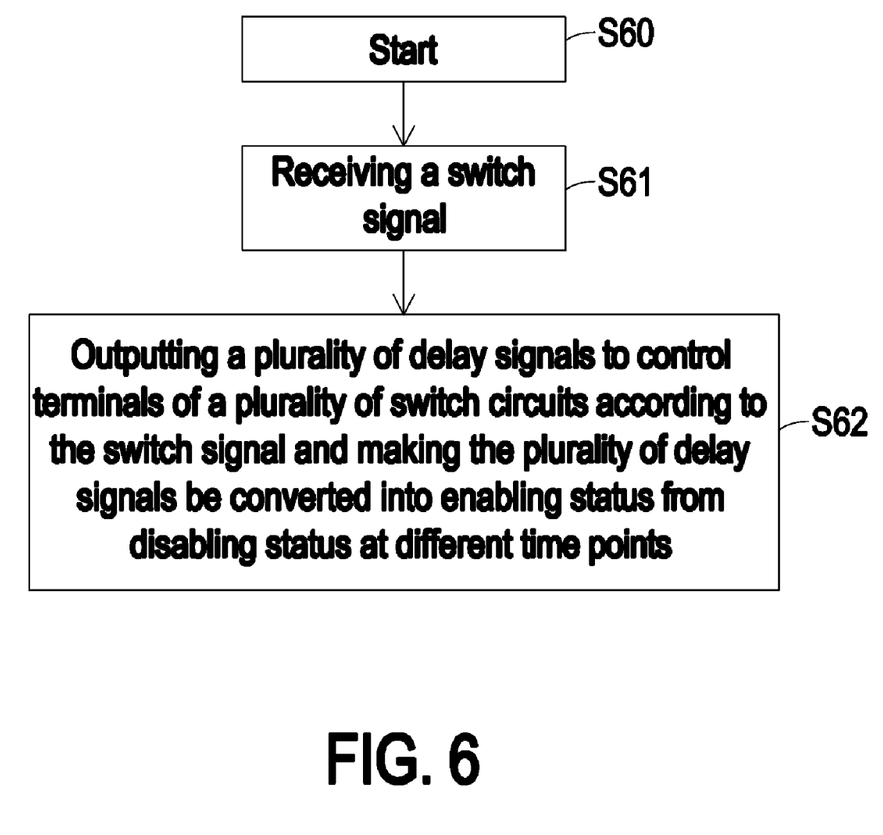
FIG. 6 is a flowchart illustrating the control method of the power supply circuit according to the preferred embodiment of the present invention.

Please refer to FIG. 6 and FIG. 4, wherein FIG. 6 is a flowchart illustrating the control method of the power supply circuit according to the preferred embodiment of the present invention. The control method of the power supply circuit 1 is used to control a plurality of switch circuits, such as the first switch circuit 17, the second switch circuit 18 and the third switch circuit 19 shown in FIG. 4 to be conducted at different time points. The control method of the power supply circuit 1 comprises the following steps.

Step S60: Start

Step S61: Receiving a switch signal

The power supply circuit 1 receives the switch signal $V_p$ transmitted from the system circuit 3 in the beginning. The switch signal $V_p$ is used to control the operations of the first switch circuit 17, the second switch circuit 18 and the third switch circuit 19.

Step S62: Outputting a plurality of delay signals to control terminals of a plurality of switch circuits according to the switch signal and making the plurality of delay signals be converted into enabling status from disabling status at different time points The phase delay circuit 13 of the power supply circuit 1 outputs the first delay signal $S_1$, the second delay signal $S_2$, and the third delay signal $S_3$ to the first switch circuit 17, the second switch circuit 18 and the third switch circuit 19, respectively, according to the switch signal $V_p$. Further, the phase delay circuit 13 makes the first delay signal $S_1$, the second delay signal $S_2$, and the third delay signal $S_3$ be converted into the enabling status from the disabling status at different time points, so that the first switch circuit 17, the second switch circuit 18 and the third switch circuit 19 can be conducted at different time points.

Figure 7:
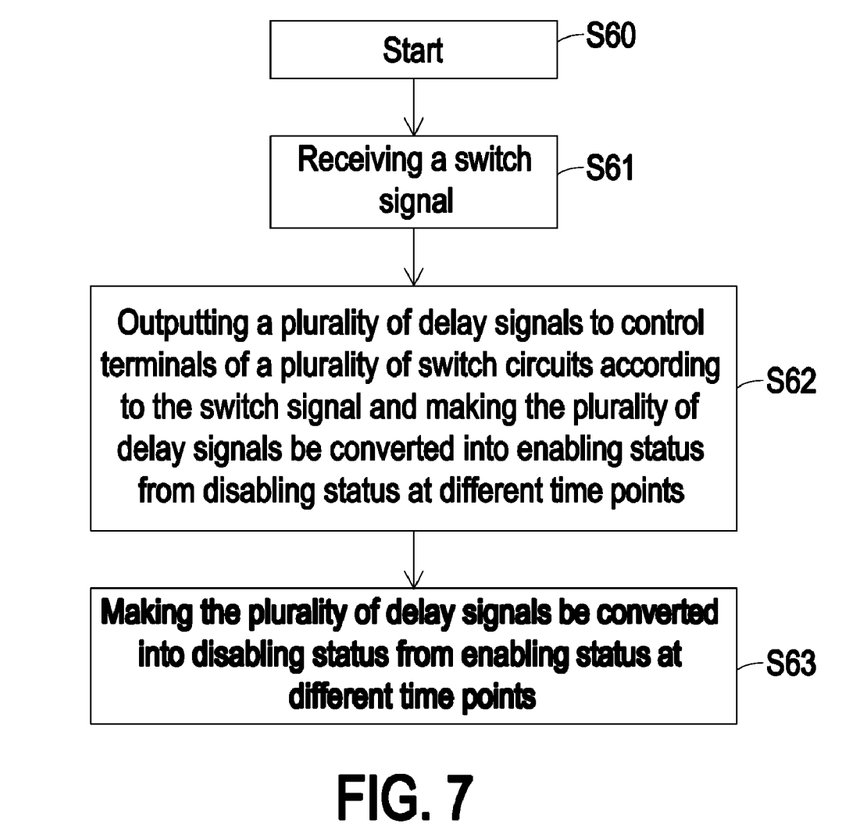
FIG. 7 is another flowchart illustrating the control method of the power supply circuit according to another preferred embodiment of the present invention.

Moreover, the first switch circuit 17, the second switch circuit 18 and the third switch circuit 19 can also be shut off at different time points. As shown in FIG. 7, the control method of the power supply circuit 1 further includes a step S63 after the step S62.

Step S63: Making the plurality of delay signals be converted into the disabling status from the enabling status at different time points The phase delay circuit 13 makes the first delay signal $S_1$, the second delay signal $S_2$, and the third delay signal $S_3$ be converted into the disabling status from the enabling status at different time points, so that the first switch circuit 17, the second switch circuit 18 and the third switch circuit 19 can be shut off at different time points.

From the above, the present invention provides a power supply circuit and the control method thereof, which utilizes the phase delay circuit to transform the switch signal into the plurality of delay signals and transmit the plurality of delay signals to the plurality of switch circuits, respectively. Since the plurality of delay signals are converted into the enabling status from the disabling status or converted into the disabling status from the enabling status at different time points, the plurality of switch circuits are accordingly conducted or shut off at different time points. Compared to the prior art, the input current of the power supply circuit of the present invention would not be increased or decreased abruptly during the operations of the switch circuits, and thus the generation of the audio noise could be eliminated. Therefore, the power supply circuit is not easy to shut down and has a better stability, and the electronic components in the power supply circuit are not easy to be damaged.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power supply circuit for receiving an input voltage to drive a first load and a second load, the power supply circuit comprising:
   a first switch circuit connected with the first load;
   a second switch circuit connected with the second load;
   a first power conversion circuit connected with the first load and the first switch circuit;
   a second power conversion circuit connected with the second load and the second switch circuit, the first power conversion circuit and the second power conversion circuit converting the input voltage into a driving voltage and transmitting the driving voltage to the first load and the second load, respectively, when the first switch circuit and the second switch circuit are conducted; and
   a phase delay circuit connected with the first switch circuit, the second switch circuit and a system circuit for generating a first delay signal and a second delay signal in response to a switch signal from the system circuit and transmitting the first delay signal and the second delay signal to control terminals of the first switch circuit and the second switch circuit, respectively, so as to make the first switch circuit and the second switch circuit be conducted or shut off,
   wherein the first delay signal and the second delay signal are converted into an enabling status from a disabling status at different time points so that the first switch circuit and the second switch circuit are conducted at different time points.

2. The power supply circuit according to claim 1 wherein the first load and the second load are light emitting diodes.

3. The power supply circuit according to claim 1 wherein the system circuit is applied in an LCD panel.

4. The power supply circuit according to claim 1 wherein the switch signal is used to control operations of the first switch circuit and the second switch circuit.

5. The power supply circuit according to claim 1 wherein the switch signal is a pulse width modulation signal.

6. The power supply circuit according to claim 1 wherein the first delay signal and the second delay signal are converted into the disabling status from the enabling status at different time points so that the first switch circuit and the second switch circuit are shut off at different time points.

7. The power supply circuit according to claim 1 wherein the phase delay circuit comprises a clock generation circuit for outputting a clock signal.

8. The power supply circuit according to claim 7 wherein the phase delay circuit comprises a first D flip-flop having a first data input terminal connected with the system circuit to receive the switch signal, a first trigger terminal connected with the clock generation circuit to receive the clock signal, and a first data output terminal connected with the first switch circuit, and the first D flip-flop generates the first delay signal according to the switch signal and the clock signal.

9. The power supply circuit according to claim 8 wherein the phase delay circuit comprises a second D flip-flop having a second data input terminal connected with the first data output terminal of the first D flip-flop to receive the first delay signal, a second trigger terminal connected with the clock generation circuit to receive the clock signal, and a second data output terminal connected with the second switch circuit, and the second D flip-flop generates the second delay signal according to the first delay signal and the clock signal.

10. The power supply circuit according to claim 1 wherein each of the first power conversion circuit and the second power conversion circuit includes a transformer for converting the input voltage into a voltage having a predetermined voltage value.

11. The power supply circuit according to claim 10 wherein each of the first power conversion circuit and the second power conversion circuit includes a plurality of rectifier diodes for rectifying the voltage transmitted from the transformer.

12. The power supply circuit according to claim 10 wherein the transformer is a center-tapped transformer.

13. The power supply circuit according to claim 1 wherein each of the first switch circuit and the second switch circuit includes a switch component.

14. A control method of a power supply circuit for controlling a plurality of switch circuits to be conducted at different time points, the control method of the power supply circuit comprising steps of:
   (a) receiving a switch signal; and
   (b) outputting a plurality of delay signals to control terminals of the plurality of switch circuits according to the switch signal and making the plurality of delay signals be converted into an enabling status from a disabling status at different time points.

15. The control method of the power supply circuit according to claim 14 wherein the switch signal is generated from a system circuit.

16. The control method of the power supply circuit according to claim 14 wherein the step (b) is performed by a phase delay circuit of the power supply circuit.

17. The control method of the power supply circuit according to claim 16 wherein the phase delay circuit comprises a plurality of D flip-flops and a clock generation circuit.

18. The control method of the power supply circuit according to claim 14 further comprising a step (c) of making the plurality of delay signals be converted into the disabling status from the enabling status at different time points.

19. A power supply circuit for receiving an input voltage to drive a plurality of loads, the power supply circuit comprising:
   a plurality of switch circuits connected with the plurality of loads, respectively;
   a plurality of power conversion circuits connected with the plurality of loads and the plurality of switch circuits, respectively, for converting the input voltage into a plurality of driving voltages and transmitting the plurality of driving voltages to the plurality of loads, respectively, when the plurality of switch circuits are conducted; and
   a phase delay circuit connected with the plurality of switch circuits and a system circuit for generating a plurality of delay signals in response to a switch signal from the system circuit and transmitting the plurality of delay signals to control terminals of the plurality of switch circuits, respectively, so as to make the plurality of switch circuits be conducted or shut off,
   wherein the plurality of delay signals are converted into an enabling status from a disabling status at different time points so that the plurality of switch circuits are conducted at different time points.

* * * * *